(12) United States Patent
Halliyal et al.

(10) Patent No.: US 6,617,215 B1
(45) Date of Patent: Sep. 9, 2003

(54) MEMORY WORDLINE HARD MASK

(75) Inventors: Arvind Halliyal, Cupertino, CA (US); Tazrien Kamal, San Jose, CA (US); Minh Van Ngo, Fremont, CA (US); Mark T. Ramsbey, Sunnyvale, CA (US); Jeffrey A. Shields, Sunnyvale, CA (US); Jean Y. Yang, Sunnyvale, CA (US); Emmanuil Lingunis, San Jose, CA (US); Angela T. Hui, Fremont, CA (US); Jusuke Ogura, Cupertino, CA (US)

(73) Assignees: Advanced Micro Devices, Inc., Sunnyvale, CA (US); Fujitsu Limited, Kanagawa-ken (JP)

( * ) Notice: Subject to any disclaimer, the term of this patent is extended or adjusted under 35 U.S.C. 154(b) by 0 days.

(21) Appl. No.: 10/109,235

(22) Filed: Mar. 27, 2002

(51) Int. Cl.$^7$ ............................................. H01L 21/336
(52) U.S. Cl. ..................... 438/288; 438/288; 438/289
(58) Field of Search ................. 438/257, 279, 438/288, 289

(56) References Cited

U.S. PATENT DOCUMENTS 6,555,436 B2 * 4/2003 Ramsbey et al. ........... 438/279

* cited by examiner

Primary Examiner—Kamand Cuneo
Assistant Examiner—Monica D. Harrison
(74) Attorney, Agent, or Firm—Mikio Ishimaru

(57) ABSTRACT

A manufacturing method for a MirrorBit® Flash memory includes providing a semiconductor substrate and depositing a charge-trapping dielectric material. First and second bit-lines are implanted and a wordline material is deposited. A hard mask material is deposited over the wordline material. The hard mask material is of a material having the characteristic of being deposited rather than grown. A photoresist material is deposited over the wordline material and is patterned to form a patterned hard mask. The patterned photoresist material is removed. The wordline material is processed using the patterned hard mask to form a wordline. The patterned hard mask material is removed.

20 Claims, 5 Drawing Sheets

MEMORY WORDLINE HARD MASK

BACKGROUND OF THE INVENTION

1. Technical Field

The present invention relates generally to semiconductor technology and more specifically to manufacturing semiconductor memory.

2. Background Art

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell is known as "MirrorBit®" Flash memory has been developed. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer charge storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

A major problem with the MirrorBit architecture has been discovered in forming uniform wordlines by processes compatible with the materials used.

A solution to this problem has been long sought but has long eluded those skilled in the art.

DISCLOSURE OF THE INVENTION

The present invention provides a manufacturing method for semiconductor devices, which includes providing a semiconductor substrate and depositing a charge-trapping dielectric layer. First and second bitlines are implanted and a wordline layer is deposited. A hard mask layer is deposited over the wordline layer. The hard mask is of an oxide material having the characteristic of being deposited rather than grown, such as a deposited oxide. A photoresist layer is deposited over the wordline layer, patterned, and used to form a patterned hard mask layer. The photoresist layer is removed. The wordline layer is processed using the patterned hard mask layer to form a uniform wordline and the patterned hard mask layer is removed. A salicide is grown without short-circuiting the first and second bitlines.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
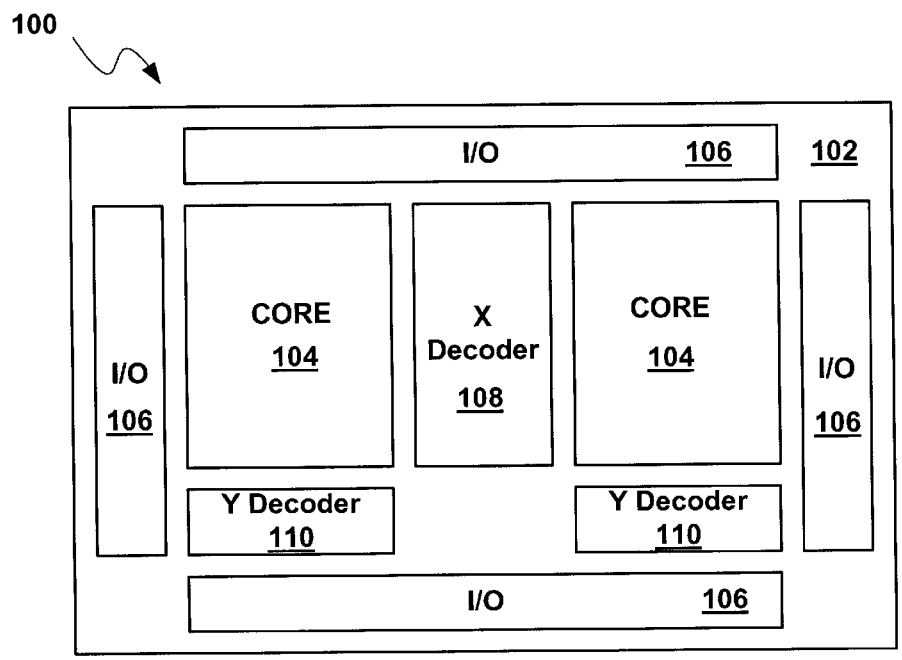
FIG. 1 (PRIOR ART) is a plan view of a conventional MirrorBit Flash EEPROM.

Referring now to FIG. 1 (PRIOR ART), therein is shown a plan view of a MirrorBit® Flash EEPROM 100, which commonly includes a semiconductor substrate 102 in which one or more high-density core regions and one or more low-density peripheral portions are formed. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "side" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
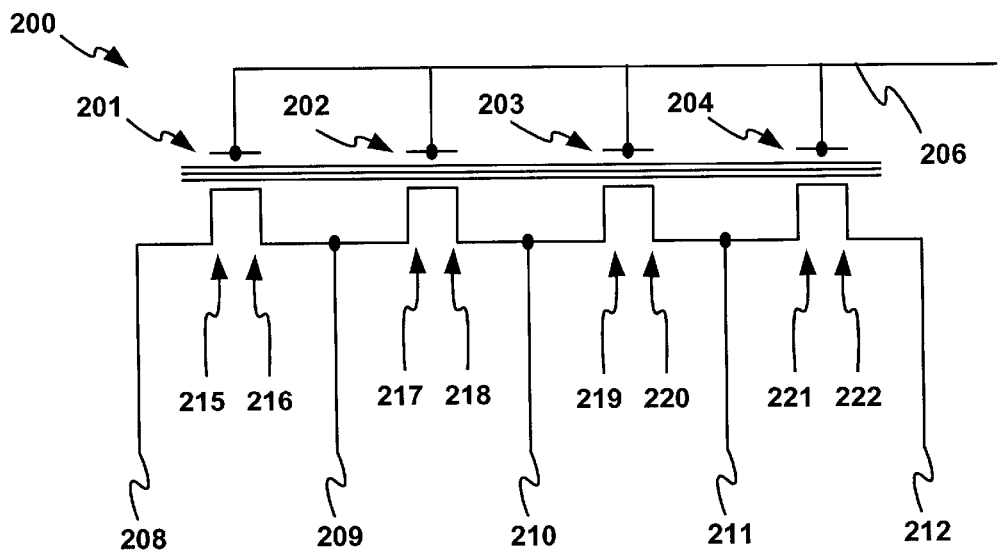
FIG. 2 (PRIOR ART) is a circuit schematic of a portion of one of the M×N array cores of FIG. 1 (PRIOR ART)

Referring now to FIG. 2 (PRIOR ART), therein is shown a circuit schematic of a portion of one of the M×N array cores 104 of FIG. 1 (PRIOR ART). The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209. and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Although adjacent memory cells share common bitlines, the adjacent memory cells do not interfere with each other because the memory cells are programmed one at a time and only one memory cell is active at a time while programming.

Figure 3:
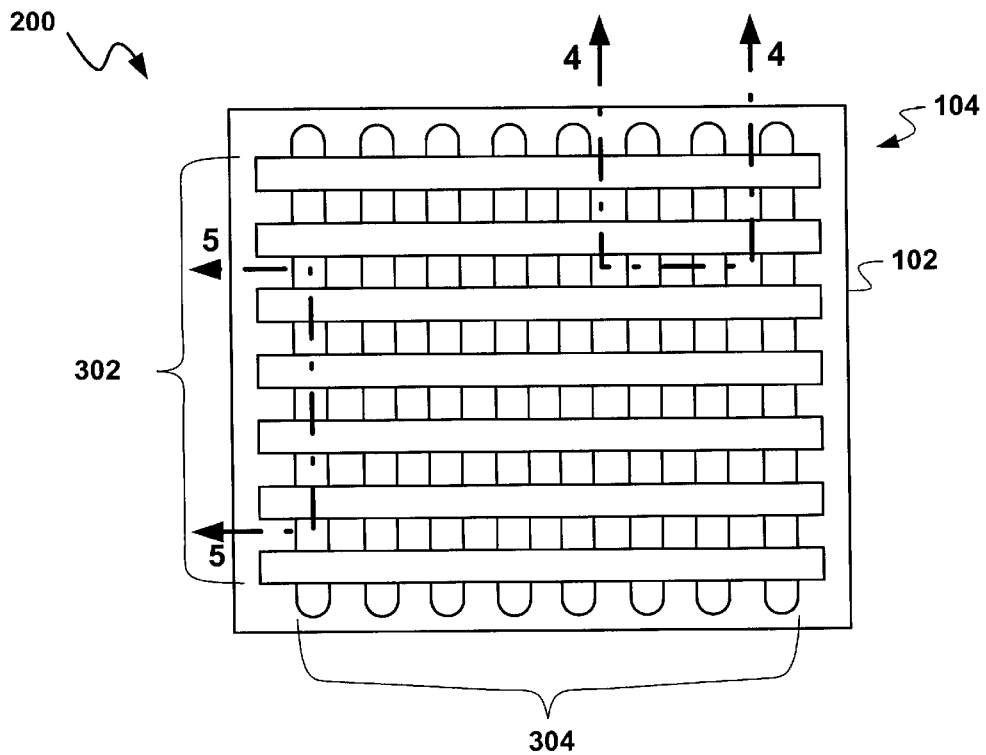
FIG. 3 (PRIOR ART) is a plan view of a portion of one of the M×N array cores 104 of FIG. 1 (PRIOR ART)

Referring now to FIG. 3 (PRIOR ART), therein is shown a plan view of a portion of one of the M×N array cores 104 of FIG. 1 (PRIOR ART). The semiconductor substrate 102 has a plurality of implanted bitlines 304 extending in parallel with a plurality of formed wordlines 302 extending in parallel and at right angles to the plurality of implanted bitlines 304. The wordlines 302 and bitlines 304 have contacts and interconnections (not shown) to the programming circuitry represented in part by x-decoders 108 and y-decoders 110 of FIG. 1 (PRIOR ART).

Figure 4:
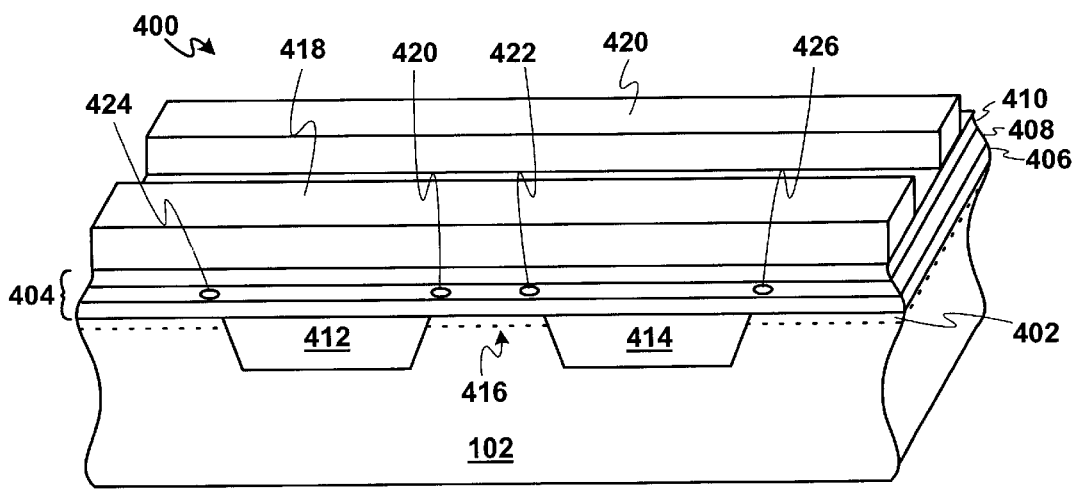
FIG. 4 (PRIOR ART) is a cross-sectional isometric view of a typical MirrorBit Flash memory cell along the line 4—4 of FIG. 3 (PRIOR ART)

Referring now to FIG. 4 (PRIOR ART), therein is shown a cross-sectional isometric view of a typical MirrorBit Flash memory cell along the line 4—4 of FIG. 3 (PRIOR ART), such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric material such as silicon dioxide ($SiO_2$) and the charge-trapping layer 408 is of a nitride dielectric material such as silicon nitride ($Si_xN_y$). The oxide-nitride-oxide configuration is frequently referred to as a matter of convenience as an "ONO layer".

The bitlines 304 of FIG. 3 (PRIOR ART) are implanted under the charge-trapping dielectric layer 404 in the semiconductor substrate 102 as typified by first and second conductive bitlines 412 and 414. They are typically of an implanted n-type material, such as arsenic, and can include an oxide portion (not shown) in some embodiments. The first and second conductive bitlines 412 and 414 are spaced apart and define a volume between them with the threshold adjustment implant 402, which is a channel 416.

A material, such as polysilicon, is deposited over the charge-trapping dielectric layer 404, patterned, etched, and stripped resulting in a wordline 418. The wordline 418 is one of the wordlines 302 in FIG. 3 (PRIOR ART).

It is understood that the implementation of each step in manufacturing has associated processing steps.

The locations 420 through 422 indicate where bits can be stored in the memory cell 400 and locations 424 and 426 are adjacent locations, which are independent of the memory cell 400.

Figure 5:
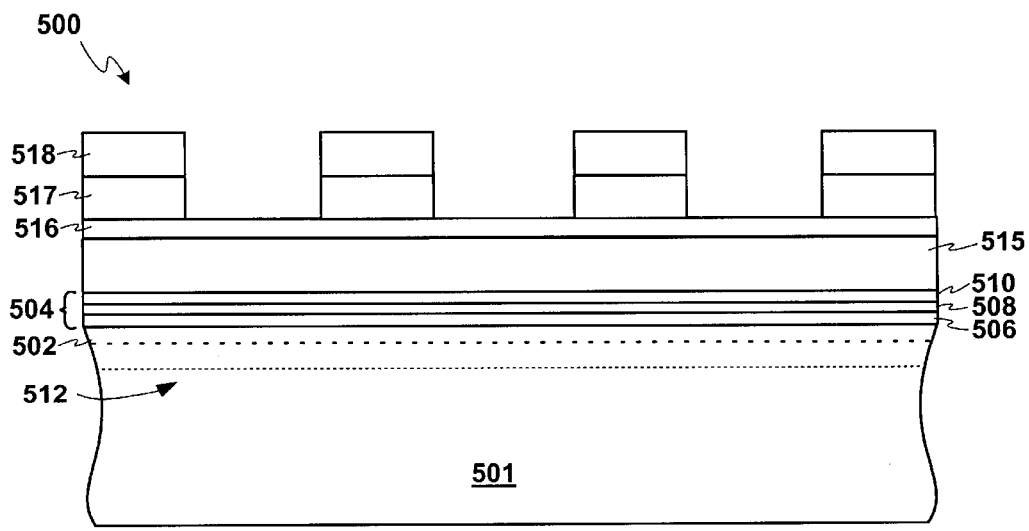
FIG. 5 is a cross-sectional view of a partially processed memory cell similar to a cross-sectional view along line 5—5 in FIG. 3 (PRIOR ART)

Referring now to FIG. 5, therein is shown a cross-sectional view of a partially processed memory cell 500 similar to a cross-sectional view along line 5—5 in FIG. 3 (PRIOR ART). A p-type silicon substrate 501 has been implanted or processed with a p-type threshold adjustment implant 502.

A charge-trapping dielectric layer 504 is deposited over the silicon substrate 501. The charge-trapping dielectric layer 504 generally can be composed of three separate layers: a first insulating layer 506, a charge-trapping layer 508, and a second insulating layer 510. The first and second insulating layers 506 and 510 may be of an oxide dielectric material such as silicon dioxide ($SiO_2$) and the charge-trapping layer 508 may be of a nitride dielectric material such as silicon nitride ($Si_xN_y$) to form an ONO layer. It will be noted that the present invention is not limited to specific dielectric or charge-trapping materials.

The bitlines, as typified by a first n-type bitline 512, are implanted under the charge-trapping dielectric layer 504 in the silicon substrate 501 and a wordline layer 515, of a material such as polysilicon, has been deposited over the charge-trapping dielectric layer 504. Again, it will be noted that the present invention is not limited to specific bitline or gate materials. For example, NPN structures are shown but the structures can also be PNP.

A hard mask layer 516 has been deposited over the wordline layer 515 and has not been processed. The hard mask layer 516 can act as an anti-reflective coating (ARC) layer or an inorganic ARC layer can be deposited as a separate layer, such as an optional ARC layer 517, but more importantly, the hard mask layer 516 is formulated to be a material that can be stripped off the wordline layer 515 without the stripping process damaging any exposed portion of the charge-trapping dielectric layer 504 at the same time.

In order to be strippable without damaging the charge-trapping dielectric layer 504, the hard mask layer 516 should be properly formulated to not affect the middle layer of the charge-trapping dielectric layer 504. The hard mask layer 516 is of a material having the characteristic of being a "deposited oxide", which is defined as being a direct deposition of an oxide material on another material as distinguished from a "grown oxide", which is defined as being formed by oxidation of another material. For example, where the charge-trapping dielectric layer 504 is an ONO layer, a deposited oxide such as deposited silicon dioxide or deposited silicon oxynitride is used. Further, it has been discovered that the silicon dioxide should be deposited rather than grown because grown silicon oxide forms integrally with the underlying polysilicon. This makes grown silicon oxide difficult to remove and its removal damages the underlying polysilicon.

More particularly, it has been discovered that the following deposition processes will provide a deposited oxide having the above characteristics:

High Temperature Deposition (deposited from 750° F. to 800° F.)
Low Pressure Chemical Vapor Deposition
Plasma Enhanced Chemical Vapor Deposition
Oxygen Rich Silicon Deposition
Tetraethylorthosilicate Oxide (TEOS) Deposition In addition, the hard mask layer 516 is made thinner than the thickness of the second insulating layer 510 and the charge-trapping layer 508 of the charge-trapping dielectric layer 504. This assures that the hard mask layer 516 is removed without damaging the charge-trapping layer 508 by the formation of holes.

A photoresist layer 518, generally of an organic photoresist material, has been deposited over the hard mask layer 516 or the optional ARC layer 517. The ARC layer 517, the hard mask layer 516 and the photoresist layer 518 have been processed to form openings 521 through 523 to expose the wordline layer 515.

In FIG. 5, both the photoresist layer 518 and the ARC layer 517 have been processed (i.e., the materials have been deposited, masked, patterned, exposed, and etched) for processing the hard mask layer 516.

Figure 6:
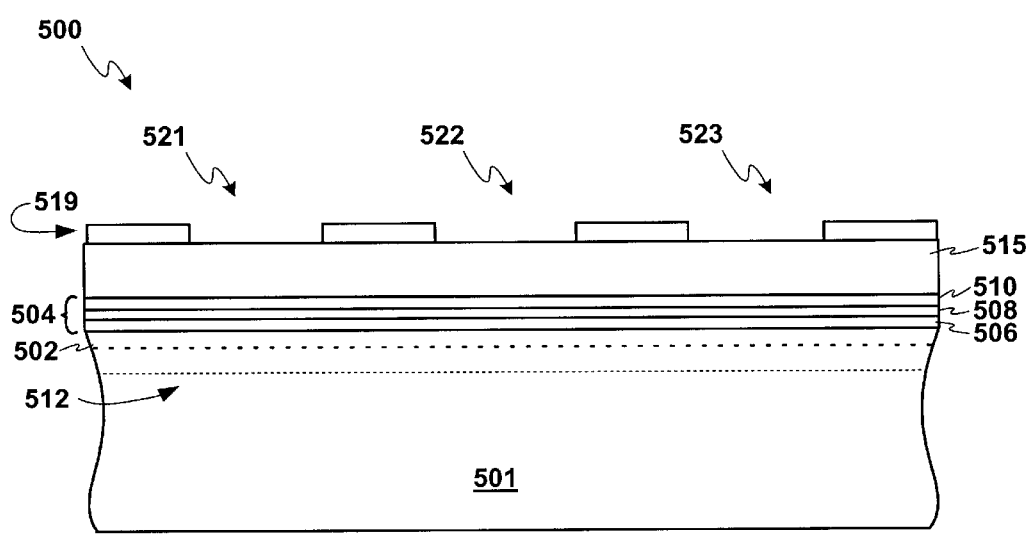
FIG. 6 is the structure of FIG. 5 after formation of a hard mask and removal of the photoresist layer and the optional ARC layer.

Referring now to FIG. 6, therein is shown the structure of FIG. 5 after formation of a patterned hard mask layer 519 and removal of the patterned photoresist layer 518 and the patterned ARC layer 517. The patterned hard mask layer 519 alone is used to create the structure of FIG. 7.

Figure 7:
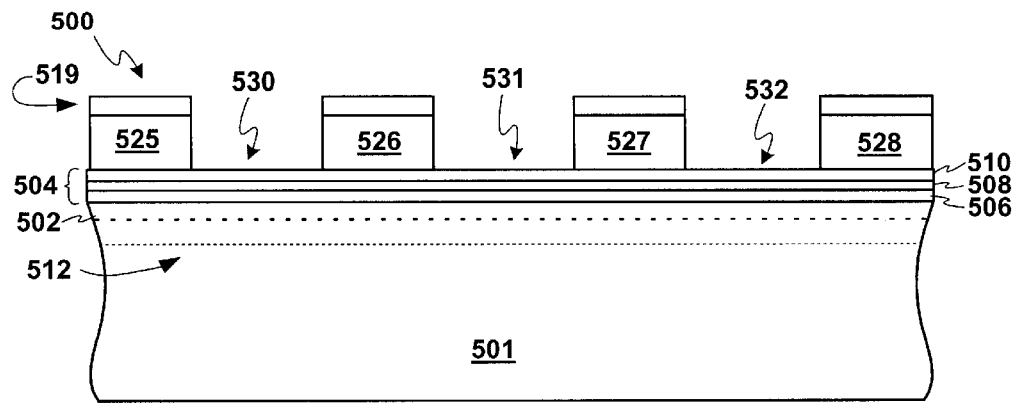
FIG. 7 is the structure of FIG. 6 after processing using the hard mask to form wordlines.

It should be noted that in the past, the patterned photoresist layer would be used to create the wordlines 525 through 528 (without the hard mask layer 516) of FIG. 7 so the ONO layer would be exposed between the wordlines and the problems noted above would occur.

Referring now to FIG. 7, therein is shown the structure of FIG. 6 after processing using the patterned hard mask layer 519 to form wordlines 525 through 528. The processing using the patterned hard mask layer 519 exposes the charge-trapping dielectric layer 504 at exposed areas 530 through 532. However, since the hard mask layer 516 material is specifically formulated so as to not damage the charge-trapping dielectric layer 504 during removal, the charge-trapping dielectric layer 504 will not be damaged at the exposed areas 530 through 532 when the patterned hard mask layer 519 is removed.

For example, where the patterned hard mask layer 519 is of a material such as silicon oxide, its removal would only cause openings in the top oxide layer of the ONO layers and not of the nitride layer. Thus, the subsequent pre-metal deposition oxide strip and oxide spacer etch photoresist layer strip would not penetrate the nitride layer. This would leave the nitride layer and the bottom oxide layer to protect the semiconductor substrate. With no access for metal to the semiconductor substrate, there will be no short-circuiting of the bitlines.

Also, at the end of the removal of the patterned hard mask layer 519, the wordlines 525 through 528 will not be damaged or reduced in size because of the clear demarcation of the deposited oxide and the underlying material of polysilicon. A grown oxide will be integral with the native oxide of the polysilicon and the polysilicon will be damaged and reduced in size at the end of the removal process.

Figure 8:
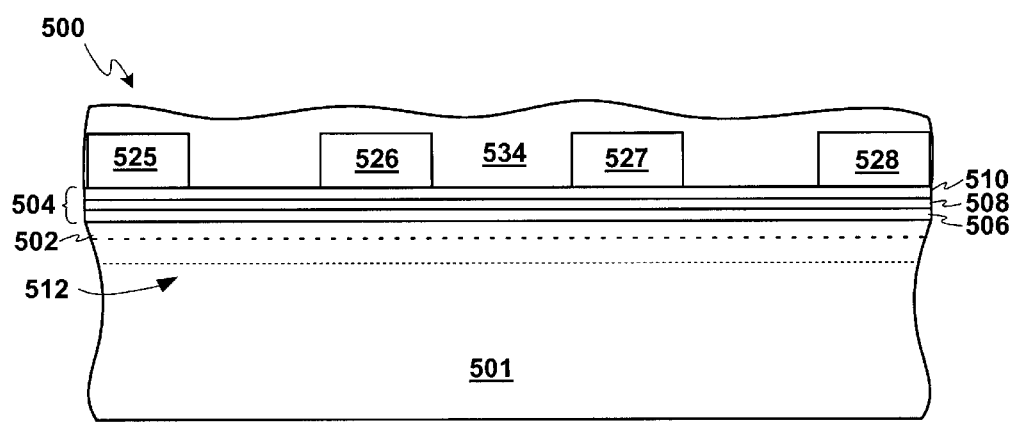
FIG. 8 is the structure of FIG. 7 after deposition of a spacer material.

Referring now to FIG. 8 therein is shown the structure of FIG. 7 after removal of the patterned hard mask layer 519. An inorganic spacer layer 534 has been deposited of a material such as silicon nitride or silicon oxynitride.

Figure 9:
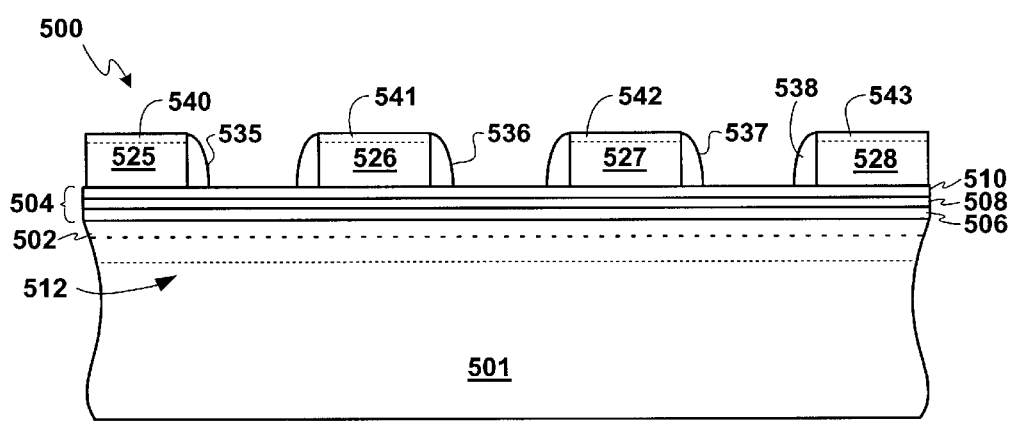
FIG. 9 is the structure of FIG. 8 with salicading.

Referring now to FIG. 9, therein is shown the structure of FIG. 8 after etching of the spacer layer 534 to form spacers 535 through 538 around the respective wordlines 525 through 528. If the spacers 535 through 538 are not formed, an additional masking step of the entire core is required or additional processing steps to provide access to the bitlines.

The memory cell 500 is also shown after application of the saliciding process to grow metal salicides 540 through 543, such as cobalt silicide, titanium silicide, or nickel silicide contacts on top of the respective wordlines 525 through 528.

Since the metal silicide will not form on the exposed ONO layer or the nitride spacers, which do not contain silicon, the metal silicide will be self-aligned on the tops of the polysilicon wordlines; i.e., salicide will be grown.

Figure 10:
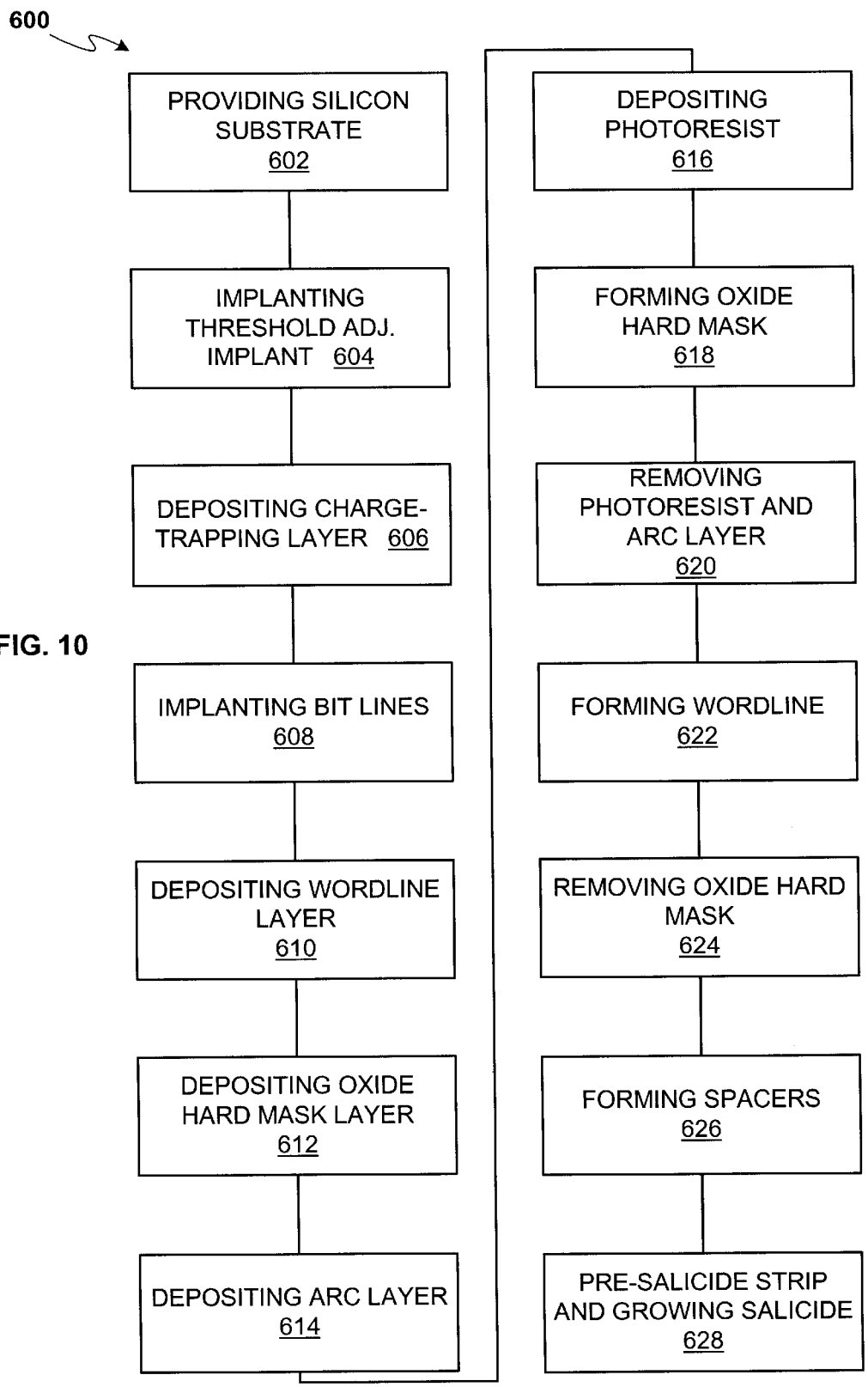
FIG. 10 is shown a simplified process chart of the present invention.

Referring now to FIG. 10, therein is shown a simplified process chart 600 of the present invention which includes: providing semiconductor substrate 602; implanting threshold adjustment implant 604; depositing charge-trapping dielectric layer 606; implanting bitlines 608; depositing wordline layer 610; depositing hard mask layer 612; depositing ARC layer 614; depositing photoresist layer 616; forming oxide hard mask 618; removing photoresist layer (and optional ARC layer) 620; forming wordline. 622; removing oxide hard mask 624; forming spacer 626, and growing salicide 628. Various alternative sequences, additions, and deletions to this process chart would be obvious to those skilled in the art from a detailed reading of the present disclosure.

Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:
   depositing a charge-trapping dielectric material over a semiconductor substrate;
   forming first and second bitlines in the semiconductor substrate;
   depositing a wordline material over the charge-trapping dielectric material;
   depositing a hard mask material over the wordline material, the hard mask material being a deposited oxide;
   depositing a photoresist material over the wordline material;
   processing the photoresist material to form a patterned photomask material;
   processing the hard mask material using the patterned photomask material to form a patterned hard mask material;
   removing the photomask material;
   processing the wordline material using the patterned hard mask material to form a wordline; and
   removing the patterned hard mask material.

2. The method of manufacturing an integrated circuit as claimed in claim 1 wherein depositing the hard mask layer uses a process selected from a group consisting of:
   High Temperature Deposition;
   Low Pressure Chemical Vapor Deposition;
   Plasma Enhanced Chemical Vapor Deposition;
   Oxygen Rich Silicon Deposition; and
   Tetraethylorthosilicate Oxide Deposition.

3. The method of manufacturing an integrated circuit as claimed in claim 1 wherein depositing the hard mask material deposits a thickness thereof thinner than the thickness of the charge-trapping dielectric material.

4. The method of manufacturing an integrated circuit as claimed in claim 1 including:
   depositing an anti-reflective coating material after depositing the hard mask material;
   using the anti-reflective coating material to form the patterned photoresist material;
   forming a patterned anti-reflective coating material; and
   removing the patterned anti-reflective coating material.

5. The method of manufacturing an integrated circuit as claimed in claim 1 including:
   depositing an anti-reflective coating material after depositing the hard mask material;
   using the anti-reflective coating material to form the patterned photoresist material;
   forming a patterned anti-reflective coating material; and
   removing the patterned anti-reflective coating material before removing the patterned hard mask material.

6. The method of manufacturing an integrated circuit as claimed in claim 1 including performing a pre-saliciding deposition strip.

7. The method of manufacturing an integrated circuit as claimed in claim 1 including:
   depositing a wordline spacer material;
   forming wordline spacers around the wordline; and
   growing a salicide material on the wordline.

8. The method of manufacturing an integrated circuit as claimed in claim 1 including:
   depositing a spacer material; and
   forming spacers around the wordline; and
   growing a salicide material on the wordline.

9. The method of manufacturing an integrated circuit as claimed in claim 1 including implanting a threshold adjustment implant into the semiconductor substrate.

10. The method of manufacturing an integrated circuit as claimed in claim 1 wherein the charge-trapping dielectric material is composed of:
    a first dielectric material;
    a charge-trapping material over the first dielectric material; and
    a second dielectric material over the charge-trapping material.

11. A method of manufacturing an integrated circuit comprising:
    providing a silicon substrate;
    depositing a charge-trapping dielectric layer over the silicon substrate;
    implanting first and second bitlines in the silicon substrate;
    depositing a polysilicon wordline layer over the charge-trapping dielectric layer;
    depositing a oxide hard mask layer over the polysilicon wordline layer, the oxide hard mask layer being a deposited oxide;
    depositing a photoresist layer over the polysilicon wordline layer;
    patterning the photoresist layer;
    processing the oxide hard mask layer using the patterned photoresist layer to form a patterned oxide hard mask layer;
    removing the patterned photoresist layer;
    processing the polysilicon wordline layer using the patterned oxide hard mask layer to form a polysilicon wordline;
    removing the patterned oxide hard mask layer without damaging the charge-trapping dielectric layer and the polysilicon wordline; and
    growing a salicide layer without short-circuiting the first and second n-type bitlines.

12. The method of manufacturing an integrated circuit as claimed in claim 11 wherein depositing the oxide hard mask layer uses a process selected from a group consisting of:
    High Temperature Deposition;
    Low Pressure Chemical Vapor Deposition;
    Plasma Enhanced Chemical Vapor Deposition;
    Oxygen Rich Silicon Deposition; and
    Tetraethylorthosilicate Oxide Deposition.

13. The method of manufacturing an integrated circuit as claimed in claim 11 wherein depositing the oxide hard mask layer deposits a thickness thereof thinner than the thickness of the charge-trapping dielectric layer.

14. The method of manufacturing an integrated circuit as claimed in claim 11 including:
   depositing an inorganic anti-reflective coating layer after depositing the oxide hard mask layer;
   patterning the inorganic anti-reflective coating layer to form a patterned inorganic anti-reflective coating layer; and
   removing the patterned inorganic anti-reflective coating layer;
   using the patterned inorganic anti-reflective coating layer to form the patterned photoresist layer.

15. The method of manufacturing an integrated circuit as claimed in claim 11 including:
   depositing an inorganic anti-reflective coating layer after depositing the hard mask layer;
   using the inorganic anti-reflective coating layer to form the patterned photoresist layer;
   forming a patterned inorganic anti-reflective coating layer; and
   removing the patterned inorganic anti-reflective coating layer before removing the patterned hard mask layer.

16. The method of manufacturing an integrated circuit as claimed in claim 11 including performing a pre-saliciding deposition strip.

17. The method of manufacturing an integrated circuit as claimed in claim 11 wherein growing the salicide layer includes growing a metal silicide selected from a group of metals consisting of cobalt, titanium, and nickel.

18. The method of manufacturing an integrated circuit as claimed in claim 11 including depositing an inorganic spacer layer and forming inorganic spacers around the polysilicon wordline before growing the salicide layer on the polysilicon wordline.

19. The method of manufacturing an integrated circuit as claimed in claim 11 wherein:
   providing the silicon substrate provides a p-doped silicon substrate; and including:
   implanting a p-type threshold adjustment implant into the p-type silicon substrate.

20. The method of manufacturing an integrated circuit as claimed in claim 11 wherein the charge-trapping dielectric layer is composed of:
   a first oxide layer;
   a nitride layer over the first oxide layer; and
   a second oxide layer over the nitride layer.

* * * * *